(12) United States Patent
Tan

(10) Patent No.: US 10,705,140 B2
(45) Date of Patent: Jul. 7, 2020

(54) METHOD AND DEVICE FOR DETECTING LOW VOLTAGE DIFFERENTIAL SIGNAL

(71) Applicants: BOE Technology Group Co., Ltd., Beijing (CN); Beijing BOE Optoelectronics Technology Co., Ltd., Beijing (CN)

(72) Inventor: Qin Tan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 348 days.

(21) Appl. No.: 15/680,481

(22) Filed: Aug. 18, 2017

(65) Prior Publication Data

US 2018/0088175 A1    Mar. 29, 2018

(30) Foreign Application Priority Data

Sep. 27, 2016  (CN) .......................... 2016 1 0852776

(51) Int. Cl.
*G01R 31/317* (2006.01)
*G01R 31/3193* (2006.01)
*G01R 31/319* (2006.01)
*G09G 5/00* (2006.01)
*G09G 3/00* (2006.01)

(52) U.S. Cl.
CPC . *G01R 31/31706* (2013.01); *G01R 31/31924* (2013.01); *G01R 31/31937* (2013.01); *G09G 3/006* (2013.01); *G09G 5/006* (2013.01); *G09G 5/003* (2013.01); *G09G 2330/12* (2013.01); *G09G 2370/14* (2013.01)

(58) Field of Classification Search
CPC ........ G01R 31/31706; G01R 31/31924; G01R 31/31937; G09G 3/006; G09G 5/006
See application file for complete search history.

(56) References Cited

U.S. PATENT DOCUMENTS

| 8,817,109 B1* | 8/2014 | Biagiotti ................ G09G 3/006 348/181 |
| 2005/0071108 A1* | 3/2005 | Kulidjian ............... G09G 3/006 702/117 |
| 2013/0253860 A1* | 9/2013 | Kim ...................... G02F 1/1309 702/58 |

(Continued)

FOREIGN PATENT DOCUMENTS

| CN | 101207835 A | 6/2008 |
| CN | 101754043 A | 6/2010 |

(Continued)

OTHER PUBLICATIONS

First Office Action, including Search Report, for Chinese Patent Application No. 201610852776.5, dated Sep. 29, 2018, 23 pages.

*Primary Examiner* — Manuel L Barbee
(74) *Attorney, Agent, or Firm* — Westman, Champlin & Koehler, P.A.

(57) ABSTRACT

Embodiments of the present application disclose a method and a device of detecting a low voltage differential signal output to a liquid crystal display panel. In the method, the low voltage differential signal is decoded into a pixel color data signal; and then blanking signals of the pixel color data signal are counted.

20 Claims, 3 Drawing Sheets

(56) References Cited

U.S. PATENT DOCUMENTS

2015/0323564 A1* 11/2015 Chu ................ G01R 27/14
324/691

FOREIGN PATENT DOCUMENTS

| | | | |
|---|---|---|---|
| CN | 102170580 | A | 8/2011 |
| CN | 103475843 | A | 12/2013 |
| CN | 103491336 | A | 1/2014 |
| CN | 104034995 | A | 9/2014 |
| CN | 104469351 | A | 3/2015 |
| CN | 104469353 | A | 3/2015 |
| CN | 104954723 | A | 9/2015 |
| CN | 104967844 | A | 10/2015 |
| EP | 0737004 | A1 * 10/1996 | ............... H04N 5/10 |

* cited by examiner

METHOD AND DEVICE FOR DETECTING LOW VOLTAGE DIFFERENTIAL SIGNAL

CROSS-REFERENCE TO RELATED APPLICATION(S)

This application claims priority to Chinese Application No. 201610852776.5, filed on Sep. 27, 2016, entitled "METHOD AND DEVICE FOR DETECTING LOW VOLTAGE DIFFERENTIAL SIGNAL", which is incorporated herein by reference in its entirety.

TECHNICAL FIELD

Embodiments of the present application relate to the field of display and test of a liquid crystal module, and more particularly, to a method and a device for detecting a low voltage differential signal (LVDS) which is output to a liquid crystal display panel.

BACKGROUND

Liquid crystal modules and related display devices have been used in various aspects of mass life; and meanwhile, since the low voltage differential signal (LVDS) is stable and reliable, and has a high transmission rate, it thus is widely used in the display device and the liquid crystal module. Since the display device and the liquid crystal module belong to two different components, and are generally manufactured by different manufacturers, parameter settings for the LVDS of the display device are often not consistent with timing parameter settings required by the liquid crystal module, resulting in abnormal screen display. In this case, it is urgently desired to provide a detection device or a detection method for finding out reasons of the abnormal screen display.

SUMMARY

According to an aspect of the present application, a method of detecting a low voltage differential signal output to a liquid crystal display panel is provided. In the method, the low voltage differential signal is decoded into a pixel color data signal; and blanking signals of the pixel color data signal are counted.

According to an embodiment of the present application, the blanking signal comprises at least one of a leading edge, a trailing edge, a line synchronization signal, and a field synchronization signal.

According to an embodiment of the present application, the method further comprises: pre-processing the low voltage differential signal.

According to an embodiment of the present application, the pre-processing the low voltage differential signal comprises: sampling the low voltage differential signal; filtering the sampled low voltage differential signal; and amplifying the filtered low voltage differential signal.

According to an embodiment of the present application, the method further comprises: performing impedance matching on the low voltage differential signal before the low voltage differential signal is pre-processed.

According to an embodiment of the present application, the method further comprises: acquiring an electrical parameter of the impedance-matched low voltage differential signal, wherein the decoding comprises decoding the pre-processed low voltage differential signal into the pixel color data signal.

According to an embodiment of the present application, the pixel color data signal comprises a line synchronization signal, a field synchronization signal, a data strobe signal, a data signal, and a clock signal.

According to an embodiment of the present application, the method further comprises: filtering a result of the counting.

According to an embodiment of the present application, the method further comprises: displaying a result of the counting.

According to another aspect of the present application, a device for detecting a low voltage differential signal output to a liquid crystal display panel. The device comprises a decoding unit and a counting unit. The decoding unit is configured to decode the low voltage differential signal into a pixel color data signal. The counting unit is configured to count blanking signals of the pixel color data signal.

According to an embodiment of the present application, the device further comprises a pre-processing unit, configured to pre-process the low voltage differential signal, and transmit the pre-processed low voltage differential signal to the decoding unit.

According to an embodiment of the present application, the pre-processing unit comprises: a sampling sub-unit, configured to sample the low voltage differential signal; a filter, configured to filter the sampled low voltage differential signal; and an amplifier, configured to amplify the filtered low voltage differential signal.

According to an embodiment of the present application, the device further comprises an impedance matching unit, configured to perform impedance matching on the low voltage differential signal, and transmit the impedance-matched low voltage differential signal to the pre-processing unit.

According to an embodiment of the present application, the device further comprises an electrical parameter acquisition unit, configured to acquire an electrical parameter of the impedance-matched low voltage differential signal, and transmit the electrical parameter to the decoding unit.

According to an embodiment of the present application, the decoding unit is configured to decode the pre-processed low voltage differential signal into the pixel color data signal based on the electrical parameter.

According to an embodiment of the present application, the device further comprises a filtering unit, configured to filter a result of the counting by the counting unit.

According to an embodiment of the present application, the device further comprises a display unit, configured to display a result of the counting by the counting unit.

According to an embodiment of the present application, the device further comprises a memory, configured to store the pixel color data signal decoded by the decoding unit

BRIEF DESCRIPTION OF THE DRAWINGS

In order to more clearly illustrate the technical solution in the embodiments of the present invention, the following drawings, which are intended to be used in the description of the embodiments, will be briefly described. It will be apparent that the drawings in the following description are merely examples of the present application. Other drawings of the art may be obtained by those skilled in the art without departing from the creative labor, in which.

DETAILED DESCRIPTION

In order to further clarify purposes, technical solutions and advantages of embodiments of the present application, the technical solutions in the embodiments of the present application will now be described clearly and completely, with reference to drawings in the embodiments of the present application. Obviously, the described embodiments are merely a part of embodiments of the present application, but not all of the embodiments. All other embodiments obtained by the skilled in the art based on the embodiments of the present application without creative labor are within the scope of the present application.

In addition, in the description of the present application, unless otherwise indicated, "a plurality of" refers to two or more.

Exemplary embodiments of the present application propose a method and a device for detecting a low voltage differential signal output to a liquid crystal display panel, which solve a problem of abnormal screen display due to inconsistent parameter settings for the low voltage differential signal with timing parameter settings required by the liquid crystal module.

Figure 1:
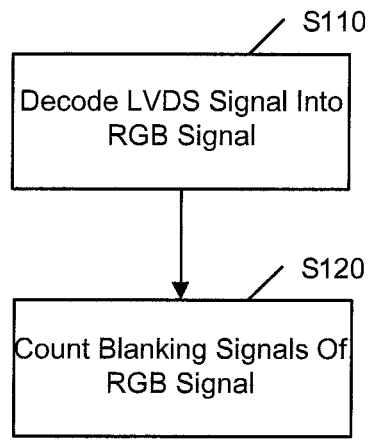
FIG. 1 is a flowchart of a method of detecting a low voltage differential signal output to a liquid crystal display panel according to an embodiment of the present application.

FIG. 1 shows a flowchart of a method of detecting a low voltage differential signal output to a liquid crystal display panel according to an embodiment of the present application. In the present embodiment, the low voltage differential signal may be a driving signal output from a drive board of a liquid crystal display device to the liquid crystal display panel.

As shown in FIG. 1, first in step S110, the low voltage differential signal is decoded into a pixel color data signal. Specifically, the pixel color data signal is a RGB signal. In the embodiment of the present application, the low voltage differential signal may be decoded into the pixel color data signal according to an image output format of 6 bits, 8 bits or 10 bits, and according to a VESA/JIEDA standard. The pixel color data signal may comprise a line synchronization signal HSYNC, a field synchronization signal VSYNC, a data strobe signal DE, a data signal DATA and a clock signal CLK. The line synchronization signal HSYNC may be used to indicate a start of a line of signals. The field synchronization signal VSYNC may be used to indicate a start of a frame of signals. The data strobe signal DE may be used to indicate a start of a valid signal. The data signal DATA is display information of the low voltage differential signal. The clock signal CLK may determine a scanning frequency of the signals.

Then in step S120, the blanking signals of the pixel color data signal are counted. In an embodiment of the present application, the blanking signal may comprise a leading edge, a trailing edge, a line synchronization signal, and a field synchronization signal. In an exemplary embodiment of the present application, an 8-bit MCU flash microcontroller may be used to trigger the counting by edge hopping of the line synchronization signal and the field synchronization signal from a rising edge to a falling edge, so as to obtain an effective resolution of the low voltage differential signal. In an embodiment of the present application, the counting is performed based on the clock signal CLK in the pixel color data signal.

It thus can be seen that the method of detecting the low voltage differential signal according to the embodiment of the present application may detect the timing of the low voltage differential signal in real time.

Figure 2:
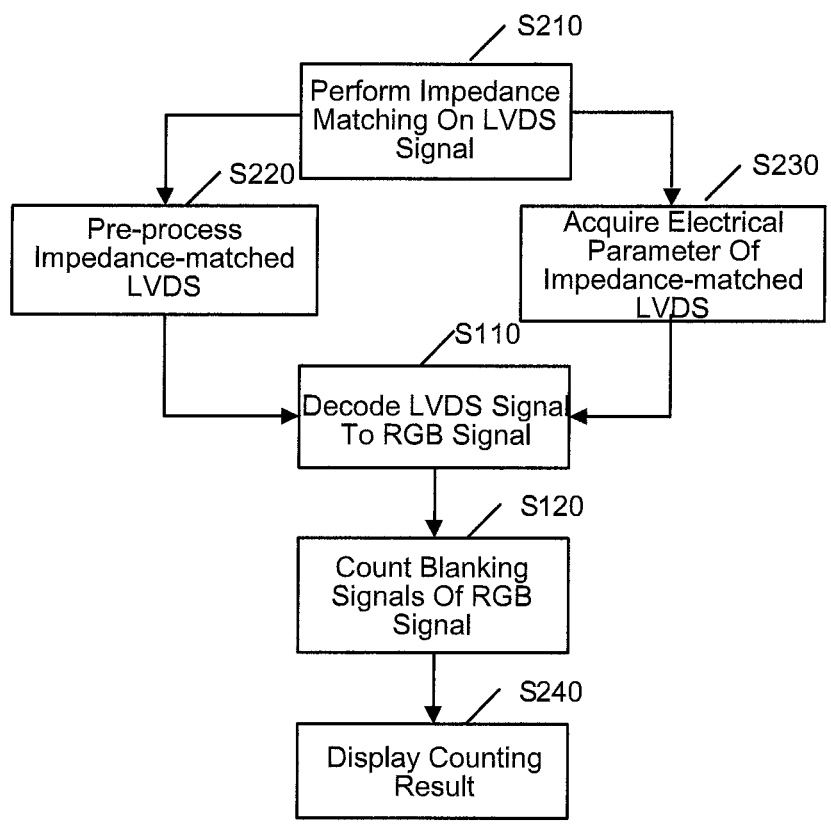
FIG. 2 is a flowchart of a method of detecting a low voltage differential signal output to a liquid crystal display panel according to another embodiment of the present application.

FIG. 2 shows a flowchart of a method for detecting a low voltage differential signal according to another embodiment of the present application. Hereinafter, the present embodiment will be described in detail with reference to the accompanying drawings, wherein description of the same portions as those of the foregoing embodiments will be appropriately omitted.

In the present embodiment, the low voltage differential signal may be subjected to a series of processing before decoding the low voltage differential signal. As shown in FIG. 2, after the low voltage differential signal is received, the low voltage differential signal is subjected to impedance matching in step S210 to obtain a low voltage differential signal with optimum power. For example, the impedance matching may be performed by connecting the low voltage differential signal in series with a resistor of about 100 ohms.

Then in step S220, the low voltage differential signal subjected to the impedance matching may be pre-processed so as to improve accuracy of detecting the timing of the low voltage differential signal in real time. In an embodiment of the present application, during the pre-processing, the low voltage differential signal is firstly sampled, and then the sampled low voltage differential signal is filtered and the filtered low voltage differential signal is amplified. By the pre-processing, a quality of the low voltage differential signal is optimal. Then, the pre-processed low voltage differential signal is decoded into the pixel color data signal in step S210.

Further in step S230, electrical parameters of the impedance-matched low voltage differential signal may be obtained. The electrical parameters of the low voltage differential signal may comprise a differential level, a zero-level deviation and a driving current strength of the low voltage differential signal. These electrical parameters together decide a high level and a low level of the low voltage differential signal. The obtained electrical parameters may be used to decode the low voltage differential signal in step S110, in order to obtain the pixel color data signal.

In an embodiment of the present application, after the blanking signals of the pixel color data signal are counted (step S120), a result of the counting may be displayed in step S240 to facilitate the user to view and judge whether or not the parameter settings of the display signal are correct. If the set parameters of the display signal coincide with the detected parameters of the display signal, information such as "Parameter Settings Correct" is further displayed, and corresponding parameter values are displayed. If the set parameters of the display signal do not coincide with the detected parameters of the display signal, "Parameter Settings Error" is further displayed, and corresponding parameter values are displayed. In addition, if the counting cannot be performed due to the low voltage differential signal failing to meet predetermined specifications, "Parameter Settings Error" is displayed.

Further, taking an error in time of each frame of low voltage differential signal into account, the counting result of a plurality of frames may be filtered to eliminate the error in time of the low voltage differential signal, before the counting result is displayed. The filtering may be, for example, median filtering or mean filtering, as well-known to the skilled in the art, and thus detailed description thereof will be omitted here.

In addition, in an embodiment of the present application, the pixel color data signal obtained by decoding may also be stored in a memory such as a FIFO memory.

Figure 3:
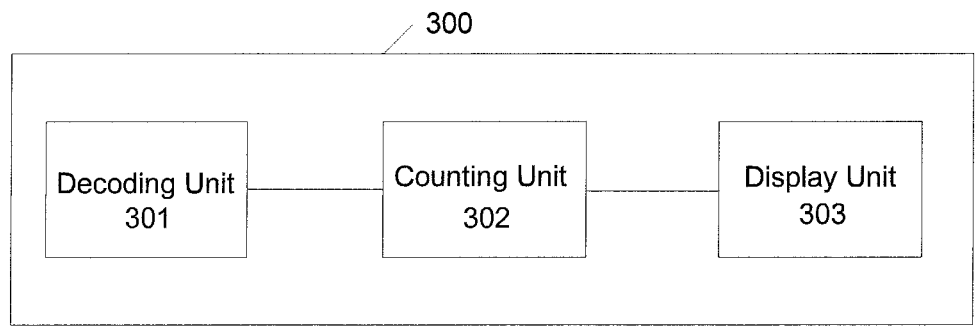
FIG. 3 is a schematic block diagram of a device for detecting a low voltage differential signal according to an embodiment of the present application.

FIG. 3 shows a schematic block diagram of a device 300 for detecting a low voltage differential signal according to an embodiment of the present application.

As shown in FIG. 3, the device 300 for detecting the low voltage differential signal of the present embodiment may comprise a decoding unit 301 and a counting unit 302.

The decoding unit 301 may decode the low voltage differential signal into a pixel color data signal according to an image output format of 6 bits, 8 bits or 10 bits and according to a VESA/JIEDA standard. The pixel color data signal may comprise a line synchronization signal HSYNC, a field synchronization signal VSYNC, a data strobe signal DE, and a data signal DATA. The line synchronization signal HSYNC may be used to indicate a start of a line of signals. The field synchronization signal VSYNC may be used to indicate a start of a frame of signals. The data strobe signal DE may be used to indicate the start of a valid signal. The data signal DATA is display information of the low voltage differential signal. The clock signal CLK may determine a scanning frequency of the signals.

The counting unit 302 may count at least one of a leading edge, a trailing edge, a line synchronization signal, and a field synchronization signal of the decoded pixel color data signal. In an exemplary embodiment of the present application, the counting unit 302 may use an 8-bit MCU flash microcontroller to trigger the counting by edge hopping of the line synchronization signal HSYNC and the field synchronization signal VSYNC from a rising edge to a falling edge, so as to obtain an effective resolution of the low voltage differential signal.

Thus, the device 300 for detecting the low voltage differential signal according to the embodiment of the present application can detect the timing of the low voltage differential signal in real time.

Figure 4:
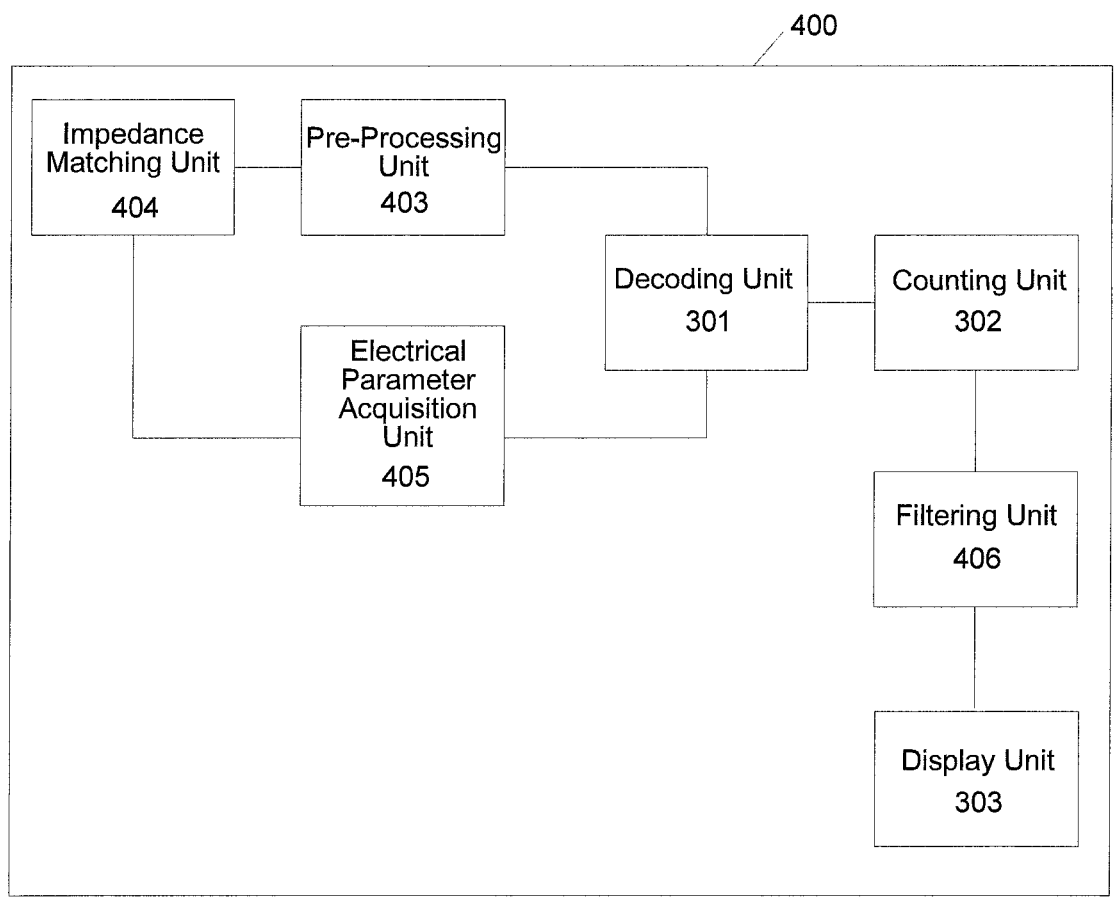
FIG. 4 is a schematic block diagram of a device for detecting a low voltage differential signal according to another embodiment of the present application.

FIG. 4 shows a schematic block diagram of a device 400 for detecting a low voltage differential signal according to another embodiment of the present application, in which the parts same as those in the previous embodiment are denoted by the same reference numerals, and description thereof will be appropriately omitted.

As shown in FIG. 4, the device 400 for detecting the low voltage differential signal according to the embodiment of the present application may comprise a pre-processing unit 403, an impedance matching unit 404, an electrical parameter acquisition unit 405 and a filtering unit 406, in addition to the decoding unit 301 and the counting unit 302.

The impedance matching unit 404 may perform impedance matching on the low voltage differential signal. For example, the impedance matching unit 404 may achieve the impedance matching by connecting each set of low voltage differential signal in series with a resistor of about 100 ohms, so as to obtain a low power differential signal with optimum power. Then, the impedance matching unit 404 transmits the matched low voltage differential signal to the pre-processing unit 403 and the electrical parameter acquisition unit 405, respectively.

After the matched low voltage differential signal is received, the pre-processing unit 403 may pre-process the received low voltage differential signal and transmit the pre-processed low voltage differential signal to the decoding unit 301.

Figure 5:
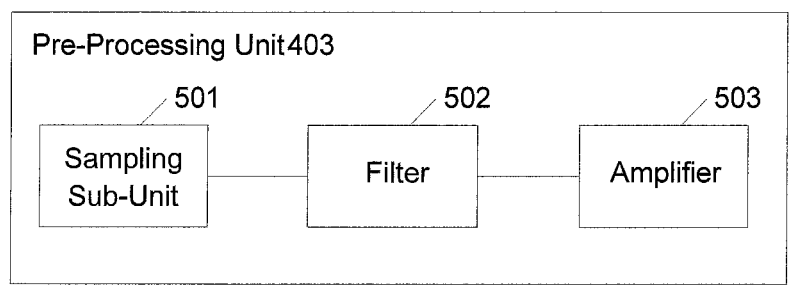
FIG. 5 is a schematic block diagram of a pre-processing unit in the device for detecting the low voltage differential signal as shown in FIG. 4.

FIG. 5 shows a schematic block diagram of an exemplary pre-processing unit 403. As shown in FIG. 5, the pre-processing unit 403 may comprise a sampling sub-unit 501, a filter 502 and an amplifier 503. The sampling sub-unit 501 may sample parameters such as a voltage and a current, of the low voltage differential signal, and convert the sampled analog parameters into digital bit values through an A/D converter and output to the filter 502. Then, the filter 502 filters the sampled low voltage differential signal to remove interference in the low voltage differential signal, thereby improving the accuracy of the counting result. The amplifier 503 may amplify the filtered low voltage differential signal.

After the matched low voltage differential signal is received, the electrical parameter acquisition unit 405 may obtain electrical parameters of the low voltage differential signal, and transmit the acquired electrical parameters to the decoding unit 301. In particular, the electrical parameters of the low voltage differential signal may comprise a differential level, a zero-level deviation and a driving current strength of the low voltage differential signal. These electrical parameters together determine a high level and a low level of the low voltage differential signal.

The decoding unit 301 may decode the pre-processed low voltage differential signal into the pixel color data signal according to the obtained electrical parameter of the low voltage differential signal, and transmit the obtained pixel color data signal to the counting unit 302. In an embodiment of the present application, the decoding unit 301 may determine the high level and the low level of the low voltage differential signal after receiving the differential level, the zero-level deviation and the driving current strength of the low voltage differential signal from the electrical parameter acquisition unit 405. The decoding unit 301 may then decode the pre-processed low voltage differential signal into the pixel color data signal according to the determined high and low levels of the low voltage differential signal.

Then, the counting unit 302 may count at least one of the leading edge, the trailing edge, the line synchronization signal and the field synchronization signal of the pixel color data signal, and transmits the counting result to the filtering unit 406. The filtering unit 406 may filter the counting result to eliminate the error in time of the low voltage differential signal. In an embodiment of the present application, the filtering unit 406 may use the median filtering algorithm or the mean filtering algorithm. The filtered counting result is provided to the display unit 303 for display, as shown in FIG. 4

In other embodiments of the present application, the counting unit 302 may also provide the counting result directly to the display unit 303 for display, as shown in FIG. 3.

The device 400 for detecting the low voltage differential signal according to the present embodiment can detect the timing of the low voltage differential signal in real time more accurately.

In addition, in other embodiments of the present application, the device for detecting the low voltage differential signal may further comprise a memory which may store the pixel color data signal decoded by the decoding unit. The memory may be, for example, a FIFO memory. It will be appreciated by the skilled in the art that other types of memory may also be used.

In view of the above, the method and the device for detecting the low voltage differential signal according to the embodiments of the present invention can detect the screen display abnormality of the liquid crystal module and the display device including the liquid crystal module. Such a display device may comprise any product or component having a display function, such as a display panel, an e-paper, a portable telephone, a tablet computer, a TV set, a notebook, a digital photo frame, a navigator, and the like.

The foregoing is merely of the particular embodiments of the present application, and the scope of the present application is not limited thereto. It will be apparent to the skilled in the art that various modifications, variations or substitutions can be made therein without departing from the scope of the technology disclosed in the present application, and such modifications are intended to be included within the scope of the present application. The scope of the present application should be determined by the scope of the appended claims.

I claim:

1. A method of detecting a low voltage differential signal output to a liquid crystal display panel, comprising:
    decoding the low voltage differential signal into a pixel color data signal;
    counting blanking signals of the pixel color data signal; and
    determining whether parameter settings of a display signal of the liquid crystal display panel are correct according to a result of the counting.

2. The method according to claim 1, wherein the blanking signal comprises at least one of a leading edge, a trailing edge, a line synchronization signal, and a field synchronization signal.

3. The method according to claim 1, further comprising: pre-processing the low voltage differential signal.

4. The method according to claim 3, wherein the pre-processing the low voltage differential signal comprises:
    sampling the low voltage differential signal;
    filtering the sampled low voltage differential signal; and
    amplifying the filtered low voltage differential signal.

5. The method according to claim 3, further comprising: performing impedance matching on the low voltage differential signal before the low voltage differential signal is pre-processed.

6. The method according to claim 5, further comprising: acquiring an electrical parameter of the impedance-matched low voltage differential signal, wherein the decoding comprises decoding the pre-processed low voltage differential signal into the pixel color data signal.

7. The method according to claim 1, wherein the pixel color data signal comprises a line synchronization signal, a field synchronization signal, a data strobe signal, a data signal, and a clock signal.

8. The method according to claim 1, further comprising: filtering a result of the counting.

9. The method according to claim 1, further comprising: displaying a result of the counting.

10. A device for detecting a low voltage differential signal output to a liquid crystal display panel, comprising:
    a processor;
    a storage, coupled to the processor and configure to store instructions that, when executed on the processor, cause the processor to be configured to:
        decode the low voltage differential signal into a pixel color data signal; and
        count blanking signals of the pixel color data signal; and
        determine whether parameter settings of a display signal of the liquid crystal display panel are correct according to a result of the counting.

11. The device according to claim 10, wherein the blanking signal comprises at least one of a leading edge, a trailing edge, a line synchronization signal, and a field synchronization signal.

12. The device according to claim 10, wherein the processor is further configured to:
    pre-process the low voltage differential signal, and transmit the pre-processed low voltage differential signal to the decoding unit.

13. The device according to claim 12, wherein the processor is further configured to:
    sample the low voltage differential signal;
    filter the sampled low voltage differential signal; and
    amplify the filtered low voltage differential signal.

14. The device according to claim 12, wherein the processor is further configured to:
    perform impedance matching on the low voltage differential signal, and transmit the impedance-matched low voltage differential signal to the pre-processing unit.

15. The device according to claim 14, wherein the processor is further configured to:
    acquire an electrical parameter of the impedance-matched low voltage differential signal, and transmit the electrical parameter to the decoding unit.

16. The device according to claim 15, wherein the processor is further configured to decode the pre-processed low voltage differential signal into the pixel color data signal based on the electrical parameter.

17. The device according to claim 10, wherein the pixel color data signal comprises a line synchronization signal, a field synchronization signal, a data strobe signal, a data signal, and a clock signal.

18. The device according to claim 10, wherein the processor is further configured to:
    filter a result of the counting by the counting unit.

19. The device according to claim 10, further comprising:
    a display unit, configured to display a result of the counting by the counting unit.

20. The device according to claim 10, further comprising:
    a memory, configured to store the pixel color data signal decoded by the decoding unit.

* * * * *